United States Patent [19]

Pena-Finol et al.

[11] Patent Number: 4,546,275

[45] Date of Patent: Oct. 8, 1985

[54] QUARTER-SQUARE ANALOG FOUR-QUADRANT MULTIPLIER USING MOS INTEGRATED CIRCUIT TECHNOLOGY

[75] Inventors: Jesus S. Pena-Finol, Caracas, Venezuela; Joseph A. Connelly, Marietta, Ga.

[73] Assignee: Georgia Tech Research Institute, Atlanta, Ga.

[21] Appl. No.: 500,540

[22] Filed: Jun. 2, 1983

[51] Int. Cl.[4] .................... H03K 5/22

[52] U.S. Cl. .................... 307/498; 328/529; 328/144; 328/160; 307/529

[58] Field of Search .................... 307/498, 529; 328/144, 328/145, 160

[56] References Cited

U.S. PATENT DOCUMENTS 3,956,643 5/1976 Hite .................... 307/498

4,019,118 4/1977 Harwood .................... 328/144

4,353,000 10/1982 Noda .................... 328/144

*Primary Examiner*—John S. Heyman

*Assistant Examiner*—B. P. Davis

*Attorney, Agent, or Firm*—Newton, Hopkins & Ormsby

[57] ABSTRACT

A four-quadrant NMOS transconductance multiplier including plural NMOS transistors formed in a substrate to produce a pair of summer stages and a pair of squaring stages which process a pair of input signals $V_1$, $V_2$ to produce an output signal $V_o$ according to the quarter-square algebraic identity, $$V_o = \tfrac{1}{4}[(V_1+V_2)^2-(V_1-V_2)^2] = V_1V_2.$$

In a preferred embodiment, the substrate doping $N_A = 6.7\times10^{15}$ cm$^{-3}$ and the channel width and channel length of each of the NMOS transistors forming the summer and squaring stages is greater than 10 $\mu$m.

22 Claims, 10 Drawing Figures

QUARTER-SQUARE ANALOG FOUR-QUADRANT MULTIPLIER USING MOS INTEGRATED CIRCUIT TECHNOLOGY

BACKGROUND OF THE INVENTION

1. Field of the Invention

This invention generally relates to an analog four quadrant multiplier using MOS integrated circuit technology, and more particularly relates to such an analog multiplier based on the quarter-square algebraic identity and utilizing low-gain differential summer and differential squaring circuits.

The multiplier of this invention, including theoretical analysis, simulations experimental test results are disclosed in detail in a doctoral thesis by PenaFinol, "Analog Four-Quadrant Multiplier Using NMOS Integrated Circuit Technology," presented to the Georgia Institute of Technology on June 4, 1982. The subject matter of this thesis is incorporated by reference herein.

2. Description of the Prior Art

There are several prior art methods used to perform analog multiplcation, namely electromechanical, magnetic (magnetoresistance, Hall effect), time-division, triangle averaging, log/antilog, quarter-square, variable transconductance and those based on A/D and D/A conversion techniques. Of these techniques, only the quarter-square and variable transconductance techniques having bandwidths above 1 MHz as does the invention disclosed herein. The quarter-square is the more accurate method. The variable transconductance has a larger bandwidth, but the quarter-square possesses one-half an order of magnitude more accuracy, typically 0.25%. At the present time, the 0.25% accuracy is obtained only through the use of expensive discrete circuitry. The design of a monolithic quarter-square multiplier with comparable or better accuracy to bandwidth ratio, would represent a significant contribution in the area of analog signal processing.

Traditionally, these multipliers have been implemented using bipolar technology. This technology has been the dominant one in the analog domain. Higher levels of monolithic integration are combining analog and digital circuits on the same MOS/LSI chip. Currently, analog integrated circuits are being fabricated using the same MOS technology employed in the realization of digital circuits.

The conventional method of performing the multiplication function based on the variable transconductance technique so far has been the only one which has been integrated in monolithic form. This method uses the inherent close matching and variable transconductance of bipolar junction transistor monolithic differential amplifiers. The circuit configuration for this method is the well-known Gilbert multiplier cell indicated in FIG. 1. The principle of operation of this circuit is briefly next explained.

FIG. 1 illustrates a conventional multiplier provided with a non-linearity cancellation circuit. This is the basic circuit utilized in commercially available transconductance multipliers such as the Motorola MC1595. It can be shown that the output is given by, $$V_o=[2R_L/I_oR_1R_2]V_1V_2. \tag{1}$$

Equation (1) is obtained from the linear conversion of the input voltages to differential currents $I_1$ and $I_2$ provided by the emitter degeneration resistors $R_1$ and $R_2$ ($I_1^*\simeq V_1/R_1$ and $I_2^*\simeq V_2/R_2$), and to the linear ratios of the collector currents given by, $$I_2/I_1=I_6/I_8=I_5/I_7. \tag{2}$$

Equation (2) is obtained assuming perfectly matching transistors and resistors and infinite common emitter current gain ($\beta$) of the transistors. Thus, monolithic integrated circuit technology should be used in the fabrication of the variable transconductance multiplier. However, a small but finite mismatching will exist in the emitter areas, ohmic resistances, and $\beta$'s.

This mismatch introduces nonlinearities and offset voltages and ultimately limits the accuracy of this compensated variable transconductance multiplier. Improved processing of device matching and laser trimming thin film resistors has produced high accuracies of about 1%. However, the extra processing steps increase considerably the cost.

The bandwidth for the multiplier shown in FIG. 1 is dominated by the equivalent input capacitance (Miller capacitance) of the bipolar transistors. Ten megahertz is a typical value for the maximum bandwidth of this type of multiplier. FIG. 1 illustrates the multiplier cell disclosed by Gilbert, B., "A Precise Four-Quadrant Multiplier with Subnanosecond Response," IEEE J. Solid-State Circuits, Vol. SC-3, pp. 365-373, Dec. 1968, and Gilbert, B., "A New Wide-Band Amplifier Technique," IEEE J. Solid-State Circuits, Vol. SC-3, pp. 353-365, Dec. 1968.

The basic Gilbert cell using NMOS devices is shown in FIG. 2. It can be shown that the output voltage is given by $$V_o \simeq \sqrt{\frac{K_P(W/L)_1(W/L)_2}{2I_o(W/L)_3}}\, V_1V_2 \tag{3}$$

where W and L are the gate width and length respectively, W/L is the resulting aspect ratio, and $K_P$ is a dimensional constant defined by $$K_p = \frac{\mu}{2}\, C_{ox} = \frac{\mu}{2}\, \frac{\epsilon_{ox}}{t_{ox}}. \tag{4}$$

where $\mu$ is the effective bulk mobility of carriers (electrons), $C_{ox}$ is the gate oxide capacitance per unit oxide area, $\epsilon_{ox}$ is the oxide dielectric constant, and $t_{ox}$ is the oxide thickness. Equation (3) is valid under small-signal conditions provided that, $$[K_P(W/L)_1V_2^2]/4I_o<<1; \text{ and} \tag{5}$$

$$[K_P(W/L)_2V_1^2]/2I_o<<1. \tag{6}$$

Because of these small-signal level constraints, the useful range for good linearity is severely limited. A nonlinear cancellation approach similar to that used for the bipolar multiplier in FIG. 1 is not suitable in the FIG. 2 multiplier because of the different type of nonlinearity associated with MOSFETs. MOSFETs have a square law current-voltage dependency while bipolar junction transistors (BJTs) have an exponential relationship. Another shortcoming associated with the FIG. 2 NMOS multiplier is that large values of transconductance are required for proper operation of the circuit. The transconductance of a MOS transistor operating in the saturation region is derived as, $$g_m = \sqrt{2K_p(W/L)I_D}\ , \tag{7}$$

where $I_D$ is the drain current. Thus, in order to significantly increase the transconductance of the MOS devices, the aspect ratio (W/L) will have to be greatly increased as well as the drain current, $I_D$. However, increasing these two variables causes new problems. For a transconductance of about $10 m\Omega^{-1}$ (typical values for BJTs are in the $100m\Omega-1$ range) at 0.1 mA drain current, an aspect ratio of about 25,000 will be required. This is extremely large and impractical. An increase in channel width, W, means higher values of parasitic capacitances because of the larger areas which lowers the frequency response. Because of second-order effects associated with short-channel devices, the value of L cannot be decreased arbitrarily. An increase of $I_D$, on the other hand, means higher power consumption. Thus, it can be expected that the overall performance of the NMOS variable transconductance multiplier will be inferior to that of the bipolar circuit.

SUMMARY OF THE INVENTION

Accordingly, one object of this invention is to provide a new and improved NMOS IC quarter-square multiplier wherein the performance of the NMOS quarter square multiplier is at least comparable to that of its bipolar variable transconductance counterpart.

Another object is to provide an NMOS multiplier which compensates for the nonlinearities of the basic cell and low values of the MOS transistor transconductances.

A further object is to provide an all-NMOS four-quadrant multiplier having improved bandwidth, accuracy, linearity and accuracy-to-bandwidth ratios.

Yet another object is to provide an all-NMOS four-quadrant multiplier which can easily be integrated to achieve low cost in quantity production.

These and other objects are achieved by providing a new and improved NMOS four-quadrant multiplier based on the quarter-square algebraic identity, which is defined as follows:

$$V_o = \tfrac{1}{4}[(V_1+V_2)^2-(V_1-V_2)^2] = V_1V_2. \tag{8}$$

In this way, the multiplication is achieved in steps. First the sum and difference of the two inputs are formed. Then these are squared. Finally the difference of squares is obtained and scaled. Thus differential summer and differential squaring stages are derived to implement the invention.

In the embodiment of FIG. 4, each differential summer stage includes first and second input NMOS transistors having respective gates connected in differential mode to a first input, and third and fourth NMOS transistors having respective gates connected in differential mode to a second input. The first and second transistors have sources connected to each other, and to a negative supply voltage ($-V_{SS}$) via a first current source, and drains respectively connected in series with fifth and sixth NMOS transistors to a positive voltage source ($+V_{DD}$). The third and fourth transistors have sources connected to each other, and to $-V_{SS}$ via a second current source, and drains connected respectively in series with seventh and eighth NMOS transistors to $+V_{DD}$. The gates of the fifth and sixth transistors are respectively connected to the interconnection between the third and seventh transistors and the interconnection between the fourth and eighth transistors, and the gates of the seventh and eighth transistors are also connected to $+V_{DD}$. Each summer stage further outputs a respective sum signal, $V_x$, or difference signal, $V_y$, depending on the polarity of the interconnection of the input signals, across the interconnection of the first and fifth transistors and the interconnection between the second and sixth transistors.

In the embodiments of FIGS. 5 and 9, the squaring circuit includes ninth and tenth NMOS transistors having sources connected to each other, and to $-V_{SS}$ via a third current source, gates connected in differential mode to the output $V_x$ of a first summer stage and drains interconnected to each other, and to $+V_{DD}$ via first resistive load $R_o$; and eleventh and twelfth NMOS transistors also having sources interconnected to each other, and connected to $-V_{SS}$ via a fourth current source, gates connected in differential mode to the first input. Drains are interconnected to the respective sources of the fifteenth and sixteenth transistors. A mirror image stage composed of transistors $M_{11}$ through $M_{20}$ is identical in structure to the squaring and summer circuits just described. For ease of identification the mirror transistors are numbered in pairs like $M_1$-$M_{11}$, $M_2$-$M_{12}$, etc. The circuit configuration above described has a differential input-output relationship as a function of device aspect ratio given by $$V_x = V_o = \sqrt{\frac{(W/L)_1}{(W/L)_2}}\,(V_1 + V_2) \tag{8}$$

and $$V_y = V_o = \sqrt{\frac{(W/L)_1}{(W/L)_2}}\,(V_1 - V_2). \tag{9}$$

where $(W/L)_1$ and $(W/L)_2$ are the aspect ratios of the above-noted first and second transistors. Here the differential input-output relationship of the two squared signals is given by $$V_{oD} = \tfrac{1}{2}K_p(W/L)_3R_o[V_x^2 - V_y^2] \tag{10}$$

where $(W/L)_3$ is the aspect ratio of the ninth and tenth transistors $R_o$ is an external or diffused resistor and $K_p$ is the transconductance parameter. Substituting Equations (8) and (9) into Equation (10) gives $$V_o = K_pR_o(W/L)_3\frac{(W/L)_1}{(W/L)_2}V_1V_2. \tag{11}$$

Coupling together the differential summer and squarer results in the complete circuit configuration for the novel analog four-quadrant multiplier according to the invention.

For certain types of applications, it is required that the resistive loads $R_o$ be replaced by MOS devices acting as active loads as indicated. For this case, in a second embodiment of the invention shown in FIG. 10 the differential input-output relationship is given by $$V_o = \sqrt{\frac{2(W/L)_3}{(W/L)_9}}\;\frac{\frac{(W/L)_1}{(W/L)_2}}{2(V_S + V_T)}\,V_1V_2 \tag{12}$$

where $(W/L)_9$ is the aspect ratio of the M29 and M30 transistors, $V_T$ is the zero-bias threshold voltage and $V_S$ is a DC bias voltage presented at the interconnection of the sources of the M9, M10, M19 and M20 transistors. Equation 12 is valid for a limited range of input voltages such that $$V_{1,2(max)} = \sqrt{\frac{(W/L)_1}{(W/L)_2}}\ (V_S + V_T). \tag{13}$$

In a preferred embodiment, the NMOS multiplier of the invention is constructed with a substrate doping of approximately $10^{15}$ cm$^{-3}$, preferrably $6.7\times10^{15}$ cm$^{-3}$. The channel length L of the NMOS transistors in the summers and multipliers is greater than 10 μm, preferrably greater than 12 μm, and the channel width is greater than 10 μm.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
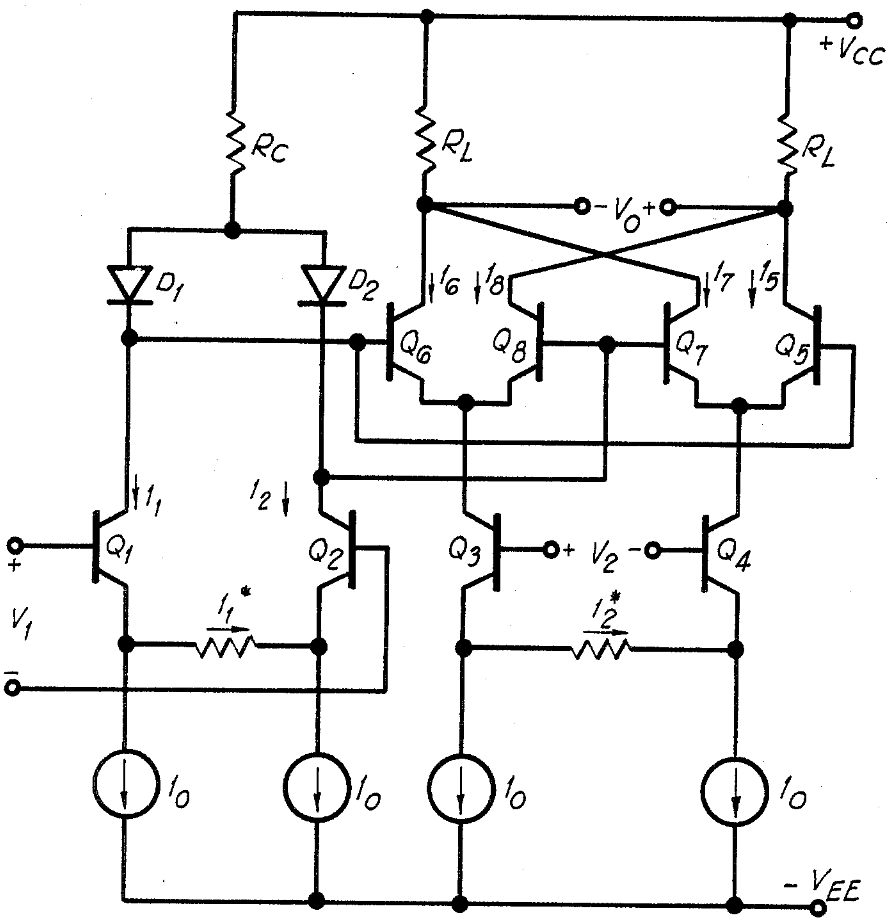
FIG. 1 is a circuit diagram of a conventional four-quadrant variable transconductance multiplier with non-linearity cancellation.
Figure 2:
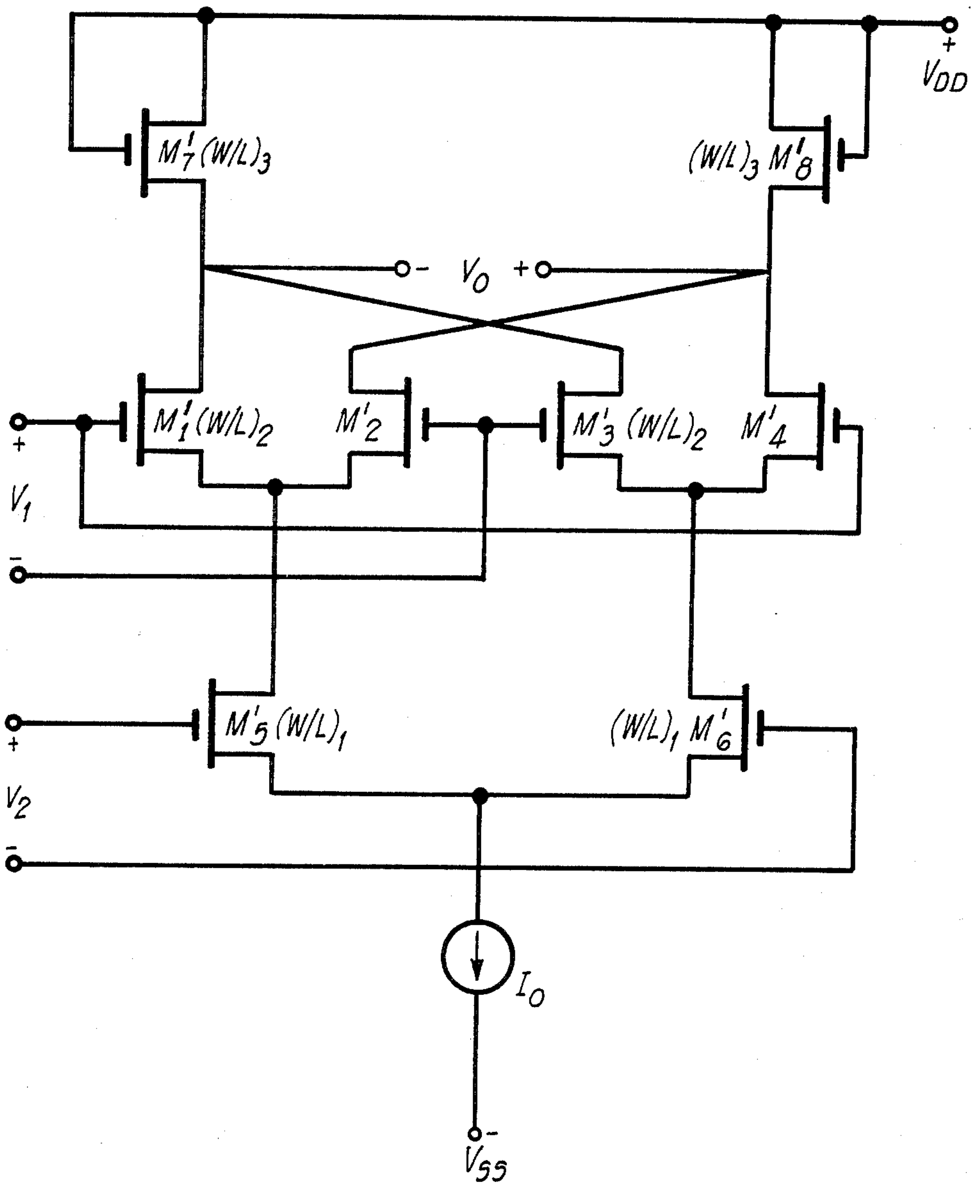
FIG. 2 is a circuit diagram of a conventional all-NMOS multiplier cell.
Figure 3:
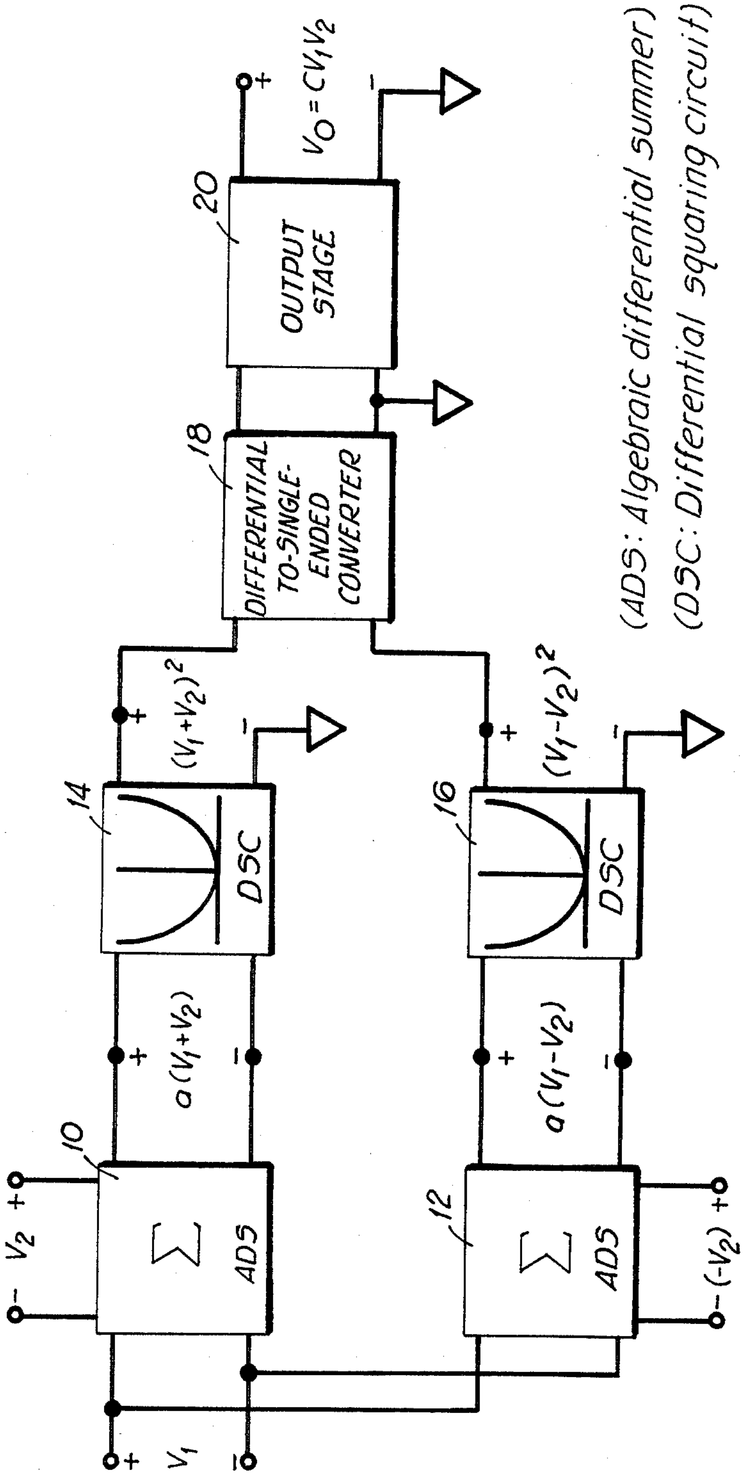
FIG. 3 is a block diagram of the four-quadrant multiplier according to the invention.

Referring now to the drawings, wherein like reference numerals designate identical or corresponding parts throughout the several views, and more particularly to FIG. 3 thereof, there is shown in block diagram form the four-quadrant multiplier of the invention. As is seen in FIG. 3, first and second input signals $V_1$ and $V_2$ are applied to two algebraic differential summers 10 and 12, which are identical in construction, to produce sum and difference signals at the respective outputs of the summers 10 and 12. The summer 12 acts as a difference-generating device when the polarity of the input signal $V_2$ is reversed, as is evident to those skilled in the art. The sum and difference outputs of the summers 10 and 12 are applied to respective differential squaring circuits, each having a single-ended output voltage which is the square of the differential input applied thereto from the respective summer. Two squaring circuits are required, the squaring circuit 14 for squaring of the sum produced at the output of the summer 10 and the squaring circuit 16 for producing the square of the difference at the output of the summer 12. Since the output voltages of the differential squaring circuits are single-ended, the differential signal between their outputs will be the difference of the squared sums. The single-ended outputs of the squaring circuits 14 and 16 are applied to the differential-to-single-ended convertor 18 which has a two-fold purpose. First, the convertor 18 rejects all common-mode signals, improving the common-mode rejection ratio. Second, it gives an output voltage reference to ground for its differential input. Thus, it must provide no gain reduction. Connected to the converter 18 is an output stage 20 which simply provides a low output impedance. Convertor 18 and output stage 20 are particularly important in stand-alone applications.

Figure 4:
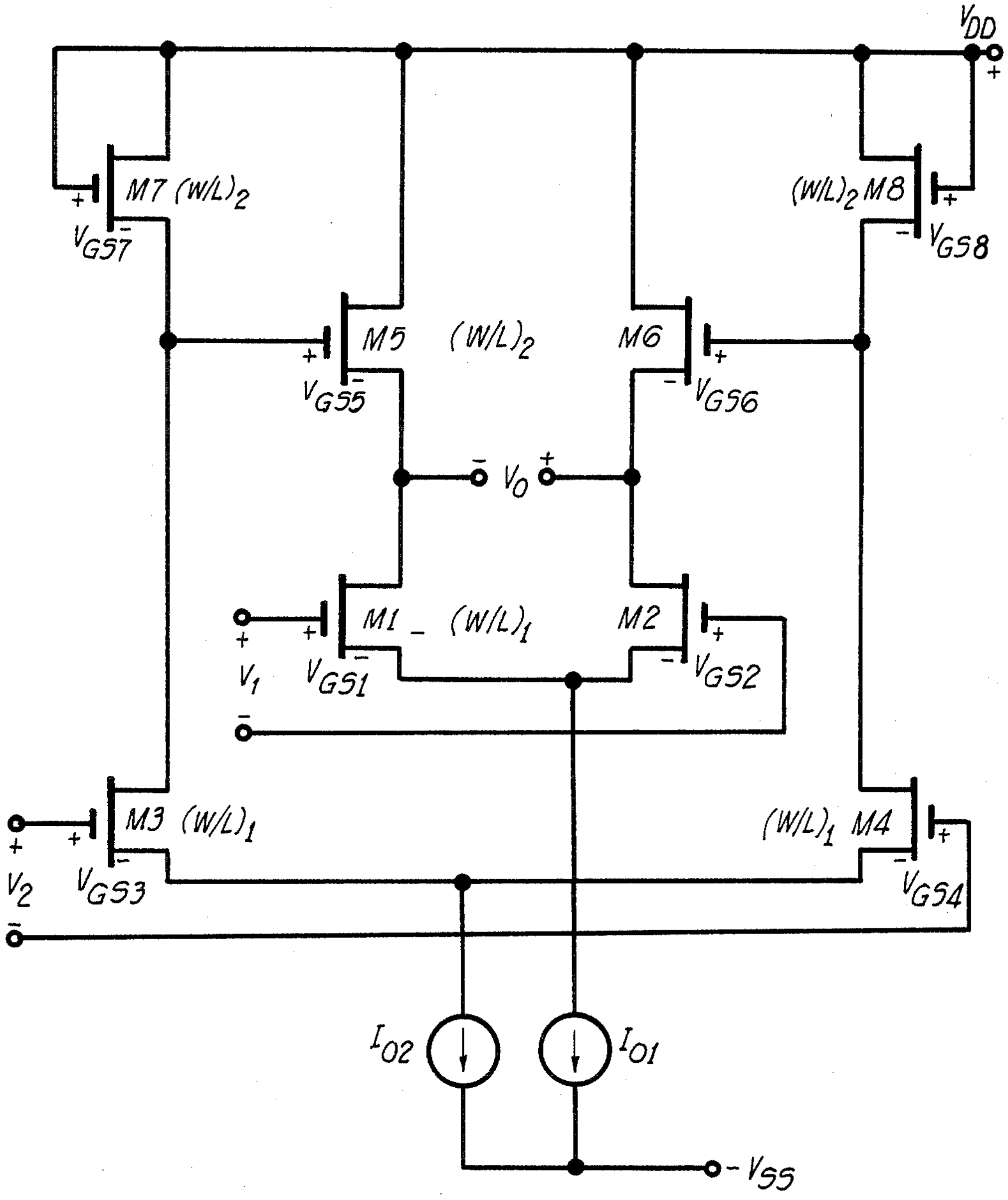
FIG. 4 is a circuit diagram of a differential summer stage used in the multiplier shown in FIG. 3.

The circuit configuration for each of the algebraic differential summers 10 and 12 is shown in FIG. 4. It is assumed that devices $M_1$ to $M_4$, and $M_5$ to $M_8$ are identical with aspect ratios equal to $(W/L)_1$ and $(W/L)_2$ respectively. Also body effect discussed hereinafter is neglected. From the circuit shown in FIG. 4.

$$V_1 = V_{GS1} - V_{GS2} \tag{14}$$

$$V_2 = V_{GS3} - V_{GS4} \tag{15}$$

$$V_o = (V_{GS5} - V_{GS6}) + (V_{GS7} - V_{GS8}). \tag{16}$$

It can be shown that, $$V_{GS7} = \sqrt{\frac{(W/L)_1}{(W/L)_2}}\ (V_{GS3} - V_T) + V_T \tag{17}$$

$$V_{GS5} = \sqrt{\frac{(W/L)_1}{(W/L)_2}}\ (V_{GS1} - V_T) + V_T \tag{18}$$

$$V_{GS6} = \sqrt{\frac{(W/L)_1}{(W/L)_2}}\ (V_{GS2} - V_T) + V_T \tag{19}$$

and $$V_{GS8} = \sqrt{\frac{(W/L)_1}{(W/L)_2}}\ (V_{GS4} - V_T) + V_T \tag{20}$$

where $V_T$ is the zero bias threshold voltage, W is the channel width and L is the channel length of the transistors shown in FIG. 4.

Substituting Eqs. (17) to (20) into (16), and then using Eqs. (14) and (15) gives $$V_o = \sqrt{\frac{(W/L)_1}{(W/L)_2}}\ (V_1 + V_2). \tag{21}$$

It can be shown that the maximum input voltages allowable for $V_1$ and $V_2$ are given by, $$V_{1max} = \pm\sqrt{\frac{2I_{01}}{K_p(W/L)_1}} \tag{22}$$

-continued $$V_{2max} = \pm\sqrt{\frac{2I_{02}}{K_p(W/L)_1}}, \quad (23)$$

where $K_p$ is the transconductance factor.

The corresponding maximum output voltage can be shown to be as follows, $$V_{o(max)} = \pm\left[\sqrt{\frac{2I_{01}}{K_p(W/L)_2}} + \sqrt{\frac{2I_{02}}{K_p(W/L)_2}}\right], \quad (24)$$

since $I_{01}=I_5+I_6$ and $I_{02}=I_7+I_8$.

Figure 5:
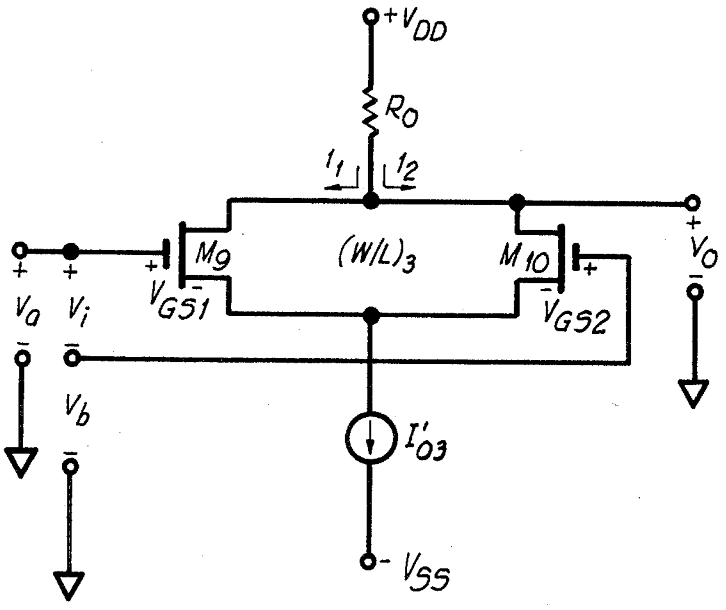
FIG. 5 is a circuit diagram of a differential squaring stage used in the multiplier shown in FIG. 3.

FIG. 5 illustrates the circuit diagram of each of the differential squaring circuits 14 and 16 of the invention. This is a well known circuit used in digital circuits to implement a NOR gate. However, when both transistors $M_1$ and $M_2$ are biased in their saturation region, this circuit performs the squaring operation. It can be shown that its transfer characteristic is given by $$V_o = -\tfrac{1}{4}K_p(W/L)_3R_oV_i^2 + V_{DC} \quad (25)$$

where $$V_{DC} = V_{DD} - K_p(W/L)_3R_o(V_s+V_T)^2. \quad (26)$$

where $V_s$ is the D.C. bias voltage shown in FIG. 5.

Figure 6:
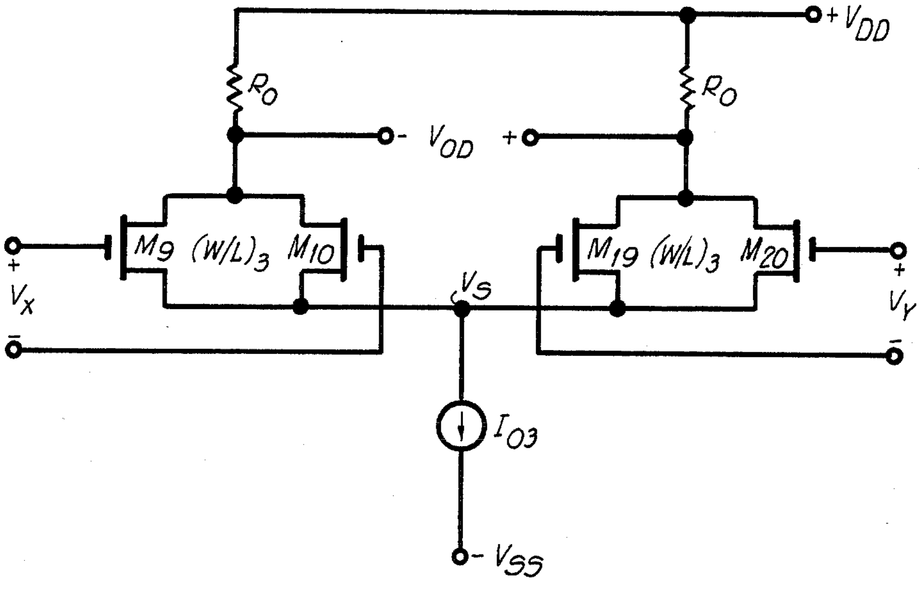
FIG. 6 is a circuit diagram of a complete squaring circuit formed of interconnected squaring stages shown in FIG. 5 used in the multiplier shown in FIG. 3.

The output voltage given by Eq. (25) is the single-ended square of the differential input $V_i$. Since two differential squaring circuits 14 and 16 are needed in order to obtain the square of the sum-and-difference of the input signals, two mirror image squaring circuits are used as shown in FIG. 6. Here the same current sink $I_{03}$ is used for both circuits in order to assure effective cancellation of the DC term, ($V_{DC}$) present at both single-ended outputs. Thus, $$V_{OD} = \tfrac{1}{4}K_p(W/L)_3R_o[V_x^2 - V_y^2]. \quad (27)$$

The maximum input voltage that can be applied to the squaring circuit is again determined by the current sink $I_{03}$ and given by $$V_{i(max.)} = \sqrt{\frac{2I'_{03}}{K_p(W/L)_3}}. \quad (28)$$

Substituting Eq. (28) into Eq. (25), the maximum output voltage is $$V_{o(max.)} = \frac{R_oI'_{o3}}{2}. \quad (29)$$

Figure 7:
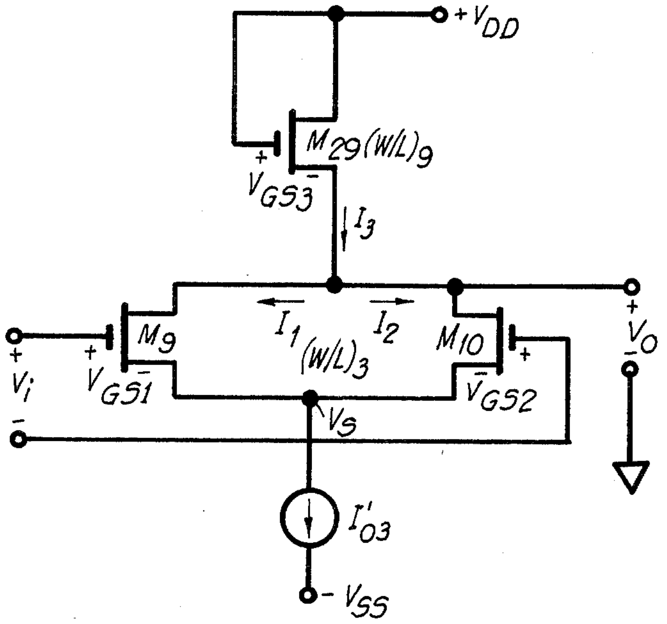
FIG. 7 is a circuit diagram of an all-NMOS differential squaring stage alternative to that shown in FIG. 5.

Replacing resistor $R_o$ in FIG. 5 by an active load results in the all-NMOS differential summer circuit shown in FIG. 7. It can be shown that the output-input relationship of this circuit is given by, $$V_o = V_{DD} - V_T - (V_s + V_T)\sqrt{\frac{2(W/L)_3}{(W/L)_9}}\left[\frac{V_i^2}{4(V_s+V_T)^2} + 1\right]^{\frac{1}{2}}. \quad (30)$$

Using the following equality, $$(x+1)^{\frac{1}{2}} = 1 + x/2 - x^2/8 + 3x^3/48 \ldots \text{ for } |x| < 1$$

$$V_o = -\sqrt{\frac{2(W/L)_3}{(W/L)_9}}\ \frac{V_i^2}{8(V_s+V_T)} + V_{DC} \quad (31)$$

where $$V_{DC} = V_{DD} - V_T - (V_s + V_T)\sqrt{\frac{2(W/L)_3}{(W/L)_9}}. \quad (32)$$

Eq. (31) is valid only for small values of $V_i$ where the inequality $$\frac{V_i^2}{4(V_s+V_T)^2} < 1 \quad (33)$$

is satisfied. The maximum value for $V_i$ can be found as $$\frac{V_{i(max)}^2}{4(V_s+V_T)^2} = 1 \quad (34)$$

$$V_{i(max)} = \pm 2(V_s + V_T).$$

Actually, $V_{i(max)}$ will be less than $2(V_s+V_T)$ because in the above series expansion, only the first two terms were considered. Thus $$V_{i(max)} < 2(V_s+V_T). \quad (35)$$

The corresponding maximum output voltage is given by $$V_{o(max)} < \sqrt{\frac{(W/L)_3}{2(W/L)_9}}\ (V_s + V_T). \quad (36)$$

Figure 8:
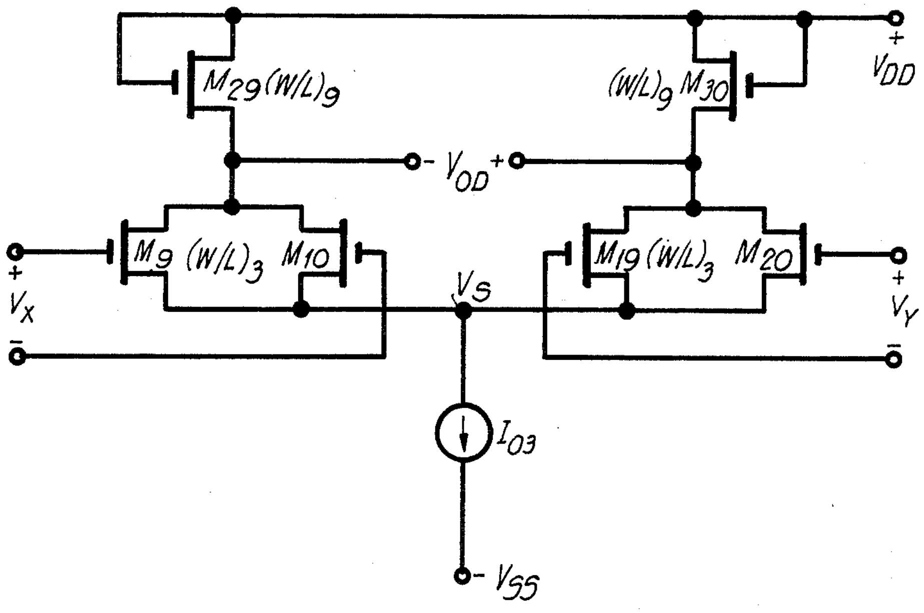
FIG. 8 is a circuit diagram of a complete all-NMOS squaring circuit alternative to that shown in FIG. 6 based on the squaring stage shown in FIG. 7.

The complete all-NMOS squaring circuit is shown in FIG. 8. In this case, the use of Eq. (31) yields $$V_{OD} = \sqrt{\frac{2(W/L)_3}{(W/L)_9}}\ \frac{1}{8(V_s+V_T)}[V_x^2 - V_y^2]. \quad (37)$$

Figure 9:
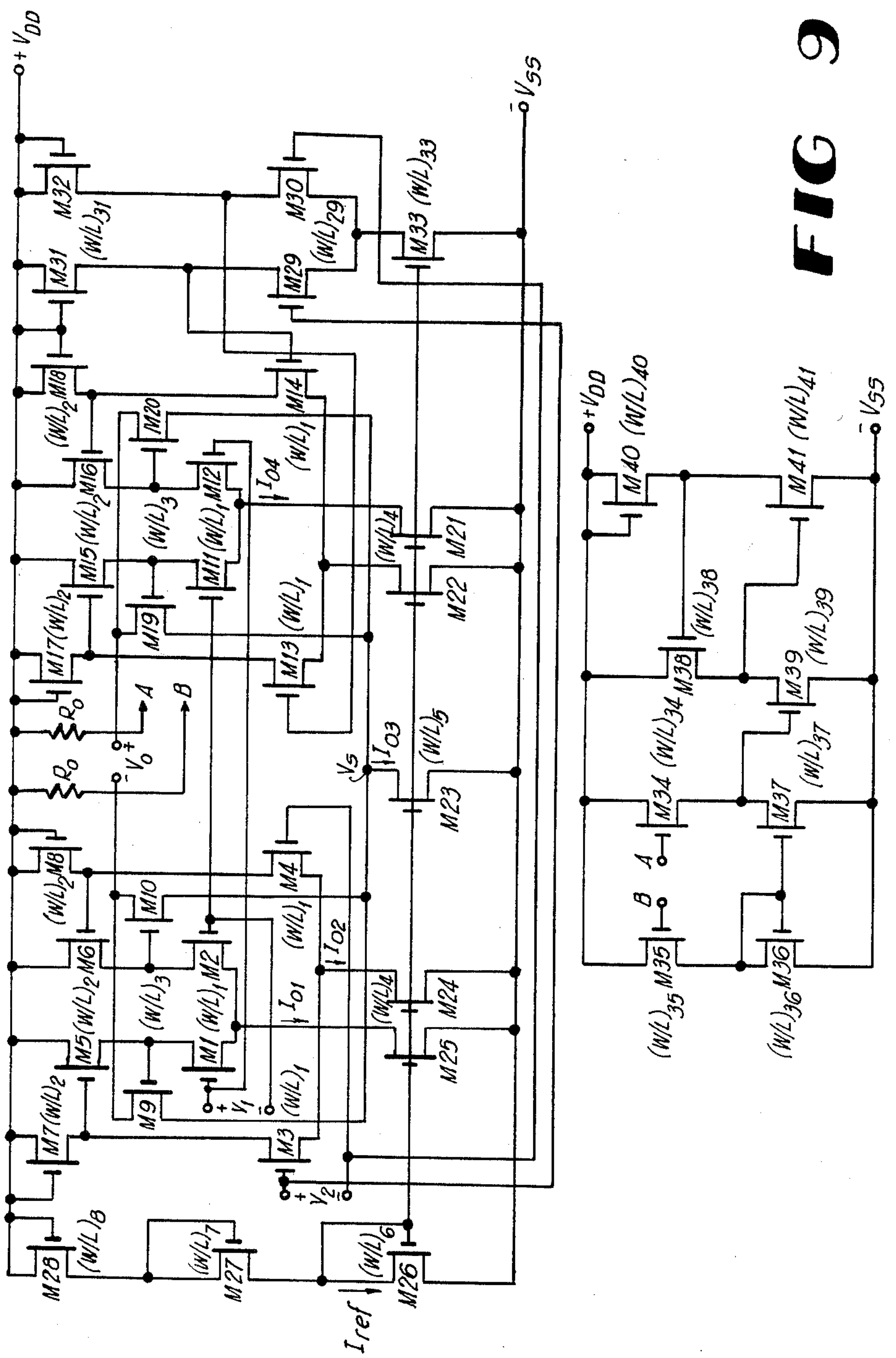
FIG. 9 is a circuit diagram of the complete circuit configuration of the resistor loaded NMOS multiplier according to the invention.
Figure 10:
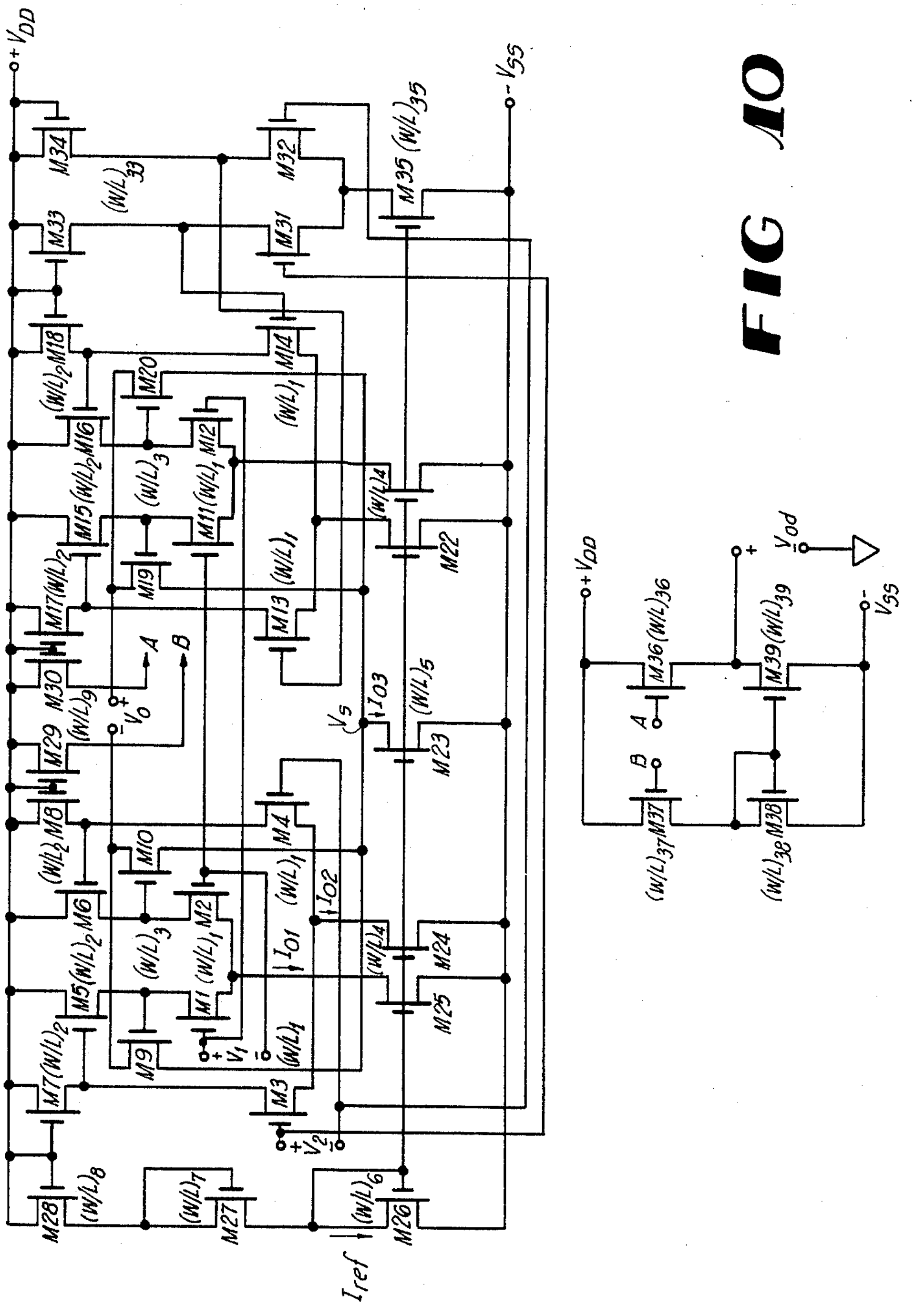
FIG. 10 is a circuit diagram of the complete circuit configuration of the all-NMOS multiplier according to the invention.

In the following discussion, two complete NMOS multiplier circuits are described with the aid of FIGS. 9 and 10. In FIG. 10 is shown an all-NMOS multiplier made up entirely of NMOS devices. This circuit includes a differential-to-single-ended converter (DSEC) 18. In FIG. 9 there is shown a multiplier implemented as a resistor loaded NMOS circuit which is composed of NMOS devices and resistors. It includes a DSEC 18 and buffering output stage 20.

Referring to FIG. 9, which shows the circuit configuration of the resistor loaded NMOS multiplier and in which the corresponding aspect ratio for each device is indicated, the analytic expression for the transfer characteristic of this circuit is derived as follows. Substitution of Eq. (21) into Eq. (27) gives $$V_o = K_pR_o(W/L)_3\frac{(W/L)_1}{(W/L)_2}V_1V_2. \quad (38)$$

Similarly, for all-NMOS multiplier indicated in FIG. 10, substitution of Eq. (21) into Eq. (37) gives $$V_o = \sqrt{\frac{2(W/L)_3}{(W/L)_9}}\ \frac{\frac{(W/L)_1}{(W/L)_2}}{2(V_s + V_T)}\ V_1V_2. \quad (39)$$

Both of the circuits shown in FIGS. 9 and 10 are composed of two summers 10 and 12, and two squaring circuit 14 and 16.

The main disadvantage associated with the all-NMOS circuit is that a smaller dynamic range will be obtained. This is due to the limitations imposed by Eq. (35) on the signals applied to the all-NMOS squaring circuits 14, 16. However, the large area required by a diffused resistor (about 20 times that of the NMOS device) will lessen the high-density advantage associated with MOS/LSI single channel technology. Thus for MOS/LSI applications, the all-NMOS approach will be more appropriate. Since in these applications mainly reactive loads are present, there is no need for an output stage. The use of diffused or even external resistors is more suitable for stand-alone applications. In this case a DSEC 18 and an output stage 20 are required.

The equations for the summing and squaring stages which relate biasing and processing quantities are the basis for the design of the entire NMOS multiplier circuit. First consider the resistor loaded NMOS multiplier (refer to FIGS. 5, 6, and 9). In order to have equal maximum input signals $[V_{1(max} = V_{2(max)} = V_{1,2(max)}]$, Eqs. (22) and (23) show that $$I_{01} = I_{02} = I_0 \quad (40)$$

From Eq. (24) the maximum output voltage of the summing stage becomes $$V_{o(max)} = \pm 2\sqrt{\frac{2I_o}{K_p(W/L)_2}}\ . \quad (41)$$

To match the output and the input of the summing and squaring stages, the value of $V_{o(max)}$ must be made equal to the maximum input voltage $[V_{i(max)}]$ that can be applied to the squaring stage and given by Eq. (28). Equating Eqs. (41) and (28) and solving for $I'_{03}$ gives $$I'_{03} = 4\frac{(W/L)_3}{(W/L)_2}\ I_0. \quad (42)$$

Since $I'_{03} = (\frac{1}{2})I_{03}$, Eq. (42) becomes $$I_{03} = 8\frac{(W/L)_3}{(W/L)_2}\ I_0. \quad (43)$$

It can be shown that, $$I_{01} = \tfrac{1}{2}K_p(W/L)_1 V_1^2(\text{max}) \quad (44)$$

Substituting Eq. (44) into Eq. (43) gives $$I_{03} = 4K_p(W/L)_3\frac{(W/L)_1}{(W/L)_2}\ V_{1,2(max)}^2. \quad (45)$$

Most practical multipliers introduce a scaling factor to realize the transfer function so set $V_o = (1/10)V_1V_2$. From Eq. (38)

$$K_pR_o(W/L)_3\frac{(W/L)_1}{(W/L)_2} = 1/10. \quad (46)$$

Combining Eq. (45) and (46) yields $$R_oI_{03} = (4/10)V_{1,2(Max)}^2. \quad (47)$$

Consider now the all-NMOS circuit (refer to FIGS. 7, 8 and 10). As before, equating Eqs. (34) and (41) and solving for $I_0$ gives $$I_0 = (\tfrac{1}{2})K_p(W/L)_2(V_s + V_T)^2. \quad (48)$$

Substituting Eq. (44) into Eq. (48) yields $$V_{1,2(max)} = \sqrt{\frac{(W/L)_1}{(W/L)_2}}\ (V_s + V_T). \quad (49)$$

Introducing the 1/10 scaling factor and using Eq. (39) gives $$\sqrt{\frac{2(W/L)_3}{(W/L)_9}}\ \frac{\frac{(W/L)_1}{(W/L)_2}}{2(V_s + V_T)} = 1/10. \quad (50)$$

The biasing in FIG. 9 is provided by a six-transistor constant current sink which is arranged in a current mirror configuration composed of devices M21-to-M28. Recognizing that devices M21-to-M26 all have equal gate-to-source voltages, it can be shown that $$I_{01} = I_{02} = \frac{(W/L)_4}{(W/L)_6}\ I_{ref} \quad (51)$$

and $$I_{03} = \frac{(W/L)_5}{(W/L)_6}\ I_{ref}. \quad (52)$$

An additional current sink is needed to implement the unity gain all-NMOS differential amplifier required to generate the $-V_2$ voltage needed to realize the difference operation of the two input signals. As previously mentioned, Eqs. (41) through (52) are the design equations of both multiplier circuits.

Nextly discussed are factors such as body effect in NMOS technology and channel length modulation effect due to electrostatic feedback which influence the circuit design.

The body effect can be explained as follows. In discrete MOS transistors the source and substrate are tied together causing zero substrate-to-source voltage. However, in a monolithic circuit, all of the devices share the same substrate. Here the substrate acts as a second gate when the source voltage varies. Its effect is similar to that of the gate of a JFET. As the source is made more positive with respect to the substrate (body), the space charge region between the channel and substrate suffers a larger potential drop. This means that for the same amount of surface charge, a large electrical field exists in the dielectric region between the gate and the channel. This in turn means that in order to obtain the same number of current carriers in the channel near the source, the gate voltage must be made more positive.

The main device parameter determining the magnitude of the body effect is the substrate impurity concentration, $N_A$. Devices with lightly doped substrates ($N_A \simeq 10^{13}$ cm$^{-3}$) have a small body effect. However, the threshold voltage, $V_{TO}$, also depends strongly on $N_A$. Thus, in designing NMOS circuits a tradeoff must be made between the minimum allowable body effect and the required threshold voltage for proper circuit operation.

The saturation region in an NMOS transistor will only be observed in MOS devices with large channel lengths, ($L > 10$ μm). As L is reduced, the saturation properties rapidly deteriorate. This is true in MOS devices fabricated on high-resistivity substrates. There are two mechanisms that contribute to the degradation of the saturation region: (1) modulation of the length of the channel by the spreading of the drain depletion region, and (2) electrostatic feedback of the drain electric field in the channel region.

The first mechanism can be explained as follows. For a MOS device operating in the saturation region, a depletion region exists at the end of the channel near the drain diffusion and spreads toward the source diffusion with increasing drain voltages. As long as L is much greater than the width of this depletion region, the reduction in the length of the conducting portion of the channel will be small and, to a first order, the drain current will be independent of the drain voltage. However, when L is small so as to be comparable to the width of the drain depletion region, the reduction in the length of the conducting portion of the channel with increasing drain voltages will be significant. In this situation the drain current becomes a function of the drain voltages, and the output resistance of the device decreases considerably.

For small L the fraction of the total channel length that is modulated by the spreading of the drain depletion region will become much larger causing the output resistance of the device in the saturation region to decrease rapidly.

The electrostatic feedback of the drain electric field into the channel region becomes signficant for devices fabricated on moderately high-resistivity substrates ($N_A < 10^{15}$ cm$^{-3}$). This mechanism adds to the modulation of the channel length by producing further degradation of the saturation region. The physical basis for this second mechanism is that since the depletion region of a P-N junction is inversely proportional to the impurity concentration, lower values on $N_A$ produce wider depletion regions. Thus, the width of the depletion regions at the drain-substrate junction and channel-substrate region can become comparable to L for low values of $N_A$. Under these conditions, a large amount of capacitive coupling occurs from the drain electrode to the channel region. As the drain voltage is increased, the electric field intensity increases and the electron population in the channel (inversion layer) must increase to compensate for the larger electric field. Thus, the drain electrode is also acting as a second-gate in controlling the channel conductance.

A low-resistivity substrate, on the other hand, will act as an electrostatic shield where the narrower depletion regions decouple the drain electric field from the channel.

Rigorous analytical treatment of the body effect and the channel length modulation effect is provided in the above cross-referenced thesis.

Bearing in mind the above-described factors, the design philisophy of the multiplier is nextly described. The choice of substrate resistivity ($N_A$) requires making a compromise between body effect, threshold voltage, frequency response, and channel length modulation effect due to electrostatic feedback. A high-resistivity substrate reduces the drain-to substrate ($C_{BD}$) and source-to-substrate ($C_{BS}$) junction capacitances. A low value of $N_A$ is desirable to reduce the body effect. However, a low $N_A$ results in a deteriorated saturation characteristic due to the electrostatic feedback of the drain electric field into the channel. Furthermore, a low value of $N_A$ causes a low threshold voltage and the possibility of obtaining a depletion device. Thus, a compromise choice of $N_A$ of approximately $10^{15}$–$10^{16}$ cm$^{-3}$ is appropriate since this value will reduce the electrostatic feedback without producing too large an increase in the junction capacitances. Specifically, $N_A = 6.7 \times 10^{15}$ cn$^{-3}$ is used. This results in enhancement devices with zero-bias threshold voltage ($V_{TO}$) of about 0.7 V. The body effect is further reduced by connecting the substrate to the most negative voltage available in the circuit ($-V_{SS}$). The modulation of the channel length by the spreading of the drain depletion region is reduced by using large values for the length of the channel ($L > 10$ μm; preferably $L > 12$ μm). This also helps to further reduce the modulation of the channel length by electrostatic feedback mechanism.

The channel width (W) is the main parameter determining the overlap capacitances which in turn limit the frequency response of the device. The minimum value of W is where second-order effects associated with small dimension devices can be neglected. This value is about 10 μm.

Complete circuit diagrams of the resistor loaded NMOS and all-NMOS multipliers are shown in FIGS. 9 and 10. The main objective in the design of both circuits is to bias all of the devices in their saturation region while simultaneously satifying Eqs. (41) through (52) for a 10 V range of input voltages. Standard 15 V power supplies are utilized. Approximate values for the aspect ratios (W/L), obtained through hand calculations, were used as the starting point. These aspect ratios are indicated in Table 1 for the resistor loaded NMOS multiplier and in Table 2 for the all-NMOS multiplier. These circuits were simulated using SPICE2G.1 and the range of input voltages obtained ws 7.2 V. The SPICE2 program was used extensively to evaluate the performance of the circuit. By changing device aspect ratios, a 10 V range of input voltages was achieved by a trial and error approach.

TABLE 1

NMOS Device Dimension for the Resistor Loaded NMOS Multiplier

| Device | Channel Width W (μm) | Channel Width L (μm) | Aspect Ratio (W/L) |
|---|---|---|---|
| M1 | 12.0 | 120.0 | 0.100 |
| M2 | 12.0 | 120.0 | 0.100 |
| M3 | 12.0 | 120.0 | 0.100 |
| M4 | 12.0 | 120.0 | 0.100 |
| M5 | 11.0 | 59.0 | 0.186 |
| M6 | 11.0 | 59.0 | 0.186 |
| M7 | 11.0 | 59.0 | 0.186 |
| M8 | 11.0 | 59.0 | 0.186 |
| M9 | 12.0 | 90.0 | 0.133 |
| M10 | 12.0 | 90.0 | 0.133 |
| M11 | 12.0 | 120.0 | 0.100 |
| M12 | 12.0 | 120.0 | 0.100 |
| M13 | 12.0 | 120.0 | 0.100 |

TABLE 1-continued

| | NMOS Device Dimension for the Resistor Loaded NMOS Multiplier | | |
|---|---|---|---|
| Device | Channel Width W (μm) | Channel Width L (μm) | Aspect Ratio (W/L) |
| M14 | 12.0 | 120.0 | 0.100 |
| M15 | 11.0 | 59.0 | 0.186 |
| M16 | 11.0 | 59.0 | 0.186 |
| M17 | 11.0 | 59.0 | 0.186 |
| M18 | 11.0 | 59.0 | 0.186 |
| M19 | 12.0 | 90.0 | 0.133 |
| M20 | 12.0 | 90.0 | 0.133 |
| M21 | 179.0 | 100.0 | 1.790 |
| M22 | 179.0 | 100.0 | 1.790 |
| M23 | 482.0 | 47.0 | 10.26 |
| M24 | 179.0 | 100.0 | 1.790 |
| M25 | 179.0 | 100.0 | 1.790 |
| M26 | 132.0 | 130.0 | 1.015 |
| M27 | 12.0 | 482.0 | 0.025 |
| M28 | 12.0 | 482.0 | 0.025 |
| M29 | 10.0 | 100.0 | 0.100 |
| M30 | 10.0 | 100.0 | 0.100 |
| M31 | 10.0 | 100.0 | 0.100 |
| M32 | 10.0 | 100.0 | 0.100 |
| M33 | 650.0 | 72.0 | 9.028 |
| M34 | 10.0 | 100.0 | 0.100 |
| M35 | 10.0 | 100.0 | 0.100 |
| M36 | 25.0 | 10.0 | 2.500 |
| M37 | 25.0 | 10.0 | 2.500 |
| M38 | 10.0 | 112.0 | 0.089 |
| M39 | 12.0 | 33.0 | 0.364 |
| M40 | 10.0 | 100.0 | 0.100 |
| M41 | 10.0 | 72.0 | 0.139 |

TABLE 2

| | NMOS Device Dimensions for the All-NMOS Multiplier | | |
|---|---|---|---|
| Device | Channel Width W (μm) | Channel Width L (μm) | Aspect Ratio (W/L) |
| M1 | 10.0 | 20.0 | 0.500 |
| M2 | 10.0 | 20.0 | 0.500 |
| M3 | 10.0 | 20.0 | 0.500 |
| M4 | 10.0 | 20.0 | 0.500 |
| M5 | 10.0 | 29.0 | 0.345 |
| M6 | 10.0 | 29.0 | 0.345 |
| M7 | 10.0 | 29.0 | 0.345 |
| M8 | 10.0 | 29.0 | 0.345 |
| M9 | 13.0 | 197.0 | 0.066 |
| M10 | 13.0 | 197.0 | 0.066 |
| M11 | 10.0 | 20.0 | 0.500 |
| M12 | 10.0 | 20.0 | 0.500 |
| M13 | 10.0 | 20.0 | 0.500 |
| M14 | 10.0 | 20.0 | 0.500 |
| M15 | 10.0 | 29.0 | 0.345 |
| M16 | 10.0 | 29.0 | 0.345 |
| M17 | 10.0 | 29.0 | 0.345 |
| M18 | 10.0 | 29.0 | 0.345 |
| M19 | 13.0 | 197.0 | 0.066 |
| M20 | 13.0 | 197.0 | 0.066 |
| M21 | 530.0 | 65.0 | 8.154 |
| M22 | 530.0 | 65.0 | 8.154 |
| M23 | 382.5 | 41.0 | 9.329 |
| M24 | 530.0 | 65.0 | 8.154 |
| M25 | 530.0 | 65.0 | 8.154 |
| M26 | 65.0 | 64.0 | 1.016 |
| M27 | 12.0 | 1237.0 | 0.010 |
| M28 | 12.0 | 1237.0 | 0.010 |
| M29 | 10.0 | 82.0 | 0.122 |
| M30 | 10.0 | 82.0 | 0.122 |
| M31 | 10.0 | 96.0 | 0.104 |
| M32 | 10.0 | 96.0 | 0.104 |
| M33 | 10.0 | 96.0 | 0.104 |
| M34 | 10.0 | 96.0 | 0.104 |
| M35 | 650.0 | 72.0 | 9.028 |
| M36 | 10.0 | 100.0 | 0.100 |
| M37 | 10.0 | 100.0 | 0.100 |
| M38 | 25.0 | 10.0 | 2.500 |

TABLE 2-continued

| | NMOS Device Dimensions for the All-NMOS Multiplier | | |
|---|---|---|---|
| Device | Channel Width W (μm) | Channel Width L (μm) | Aspect Ratio (W/L) |
| M39 | 25.0 | 10.0 | 2.500 |

Nextly discussed are considerations concerning chip layout. The main consideration of an integrated circuit layout is to find a scheme which minimizes the chip area and does not require metal-over-metal crossovers while maintaining proper element placement for device matching and thermal considerations. Several trials are always required unless a computeraide technique is employed. The components are moved around until an adequate pattern is found. Thus, there are a near infinite number of ways of laying out a given circuit. Primary considerations must be given to the placement of matching devices. If there is source of heat in the circuit, it is best placed far away and on one axis of symmetry of the matching devices. In this way, the matching devices are located on an isothermal line. This consideration will insure that all device parameters will track (follow) each other with temperature variations (thermal track). Furthermore, in order to insure that two matched devices carry the same drain current at the same gate-source voltage, it is necessary that these devices not only have the same (W/L), but also have the same W and the same L. This is known as dc voltage tracking.

It is critical that devices M1-through-M4 and devices M5-through-M8 in FIG. 9 be located symmetrically and in close proximity. Furthermore, these devices together with devices M9 and M10 should be placed in close proximity and symmetrically with the mirror image cell composed of devices M11-through-M20.

Another inportant consideration in chip layout is the parasitic effects created by the metalization of the circuit. The intrinsic and parasitic capacitances of the MOS devices must be considered. Besides these capacitances, there are other parasitic capacitive effects created by metal over oxide regions. The metal over field oxide capacitance is similar to the intrinisic capacitance of the device. Because the field oxide is approximately 10 times as thick as the gate oxide, this capacitance is about an order of magnitude smaller than the intrinsic capacitance of the device. However, the effect of field oxide capacitance becomes important in chips with complex interconnections and large metal areas. This capacitance is not significantly voltage dependent for voltages less than than the field inversion voltage. The metal-thick over oxide-N-region capacitance is usually slightly larger than the previous one since the thick oxide over N-regions is thinner than the field oxide. This is the capacitance that frequently contributes crosstalk from one signal line to another in metal crossovers. Therefore, these two parasitic effects should be considered in the chip layout.

Recapitulating, above described is a new circuit configuration of an analog four-quadrant multiplier using NMOS integrated circuits technology. The multiplier is based on the quarter-square algebraic identity and utilizes differential summer and differential squaring circuits. The summing stage is based on a nonlinearity cancellation associated with all-NMOS differential amplifier circuit, resulting in a highly linear transfer characteristic. The squaring stage is based on the inherent square-law characteristic of the NMOS device operating in the saturation region. Thus, a piecewise-linear approximation or other realization of the square-law characteristic is unnecessary.

Two circuits are proposed. One of these circuits uses NMOS devices and load resistors, and is intended for stand-alone applications. The other circuit, which has a. smaller dynamic range, uses only NMOS devices and is intended for MOS/LSI applications.

Using the SPICE2G.1 simulation program, the simulated $-3$ dB small-signal bandwidth of the NMOS multiplier is over five times larger (54 MHz) than presently commercial available bipolar variable transconductance multipliers. The resulting nonlinearity (0.9%) is of the same order of magnitude as the bipolar counterpart. This results in a smaller accuracy-to-bandwidth ratio ($2.6\times10^{-8}$%/Hz) than those encountered in A/D and D/A types of multipliers ($5.0\times10^{-8}$/Hz). The simulated power consumption of the NMOS multiplier circuit (93 mW) is about one half that of the bipolar circuit.

The main limitations associated with NMOS integrated circuit techology to the realization of the NMOS multiplier are the body effect and the channel length modulation effect. These effects are reduced by using a low substrate doping concentration ($N_A=6.7\times10^{+15}$ $cm^{-3}$) and devices with long channels ($L>10$ μm). These design considerations also reduce the electrostatic feedback mechanism without producing too large an increase in the junction capacitance of the NMOS devices. This results in near optimum bandwidth.

The comparison of the simulated NMOS multiplier with the bipolar counterpart shows that the NMOS multiplier yields better characteristics. The body effect is the main source of nonlinearities. By using the isolation region or dielectric isolation on the NMOS devices, the body effect is eliminated and a 0.1% nonlinearity can be obtained. Although this would increase considerably the processing complexity, the resulting improvement of accuracy seems to justify it. Although the above-described quarter-square multiplier is disclosed as implemented in NMOS technology, it could be implemented in either single channel (NMOS or PMOS) or CMOS technology. The principal motivating factor for the realization of analog circuits in NMOS or PMOS technology is that single channel devices have substantial density advantages over CMOS for digital applications.

However, the constraints on single channel technology make the design more difficult because of the lack of complementary devices, and because of the limitations imposed by the body effect in analog applications. In spite of these problems, it has been proven that careful design can give performances in single channel devices comparable to CMOS. The use of NMOS over PMOS is preferred because NMOS will yield higher frequency devices. This is due mainly to the intrinsic electron mobility in silicon (1,300 $cm^2$/v-s at normal field intensities) being about three times as large as hole mobility (450 $cm^2$/v-s). Consequently, the PMOS device will have approximately three times the ON resistance of an equivalent NMOS transistor of the same geometry and at the same operating bias point. Hence, NMOS circuits can be made smaller for the same complexity as PMOS. In other words, the NMOS device will require less area than the PMOS device to achieve the same resistance. Due to the resulting smaller areas, smaller junction parasitic capacitances will result. This produces faster devices in switching applications and better frequency response in analog circuits. The same type of design using PMOS devices is equally feasible, but their performance will be inferior to that of NMOS devices.

Other important considerations for using NMOS technology are input offset voltage and threshold voltage. It is known that the minimum input offset voltage associated with MOS differential amplifiers is achieved with NMOS devices using polycrystalline silicon gates. Due to the lower value of the gatesubstrate work function for NMOS devices, lower values of threshold voltages are obtained using NMOS technology.

Also, by reducing supply voltages, the second order effects associated with small dimension MOSFET devices can be eliminated. Thus, the invention can perform properly even for L and $W\leqq10$ μm.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A four-quadrant quarter-square MOS transconductance multiplier, comprising:

a substrate;

plural MOS transistor formed in said substrate to form first and second differential summer stages each having a pair of inputs ($V_1$, $V_2$) and an output, and a pair of differential squaring stages, each having an input coupled to the output of a respective summer stage, said squaring stages interconnected to produce an output $V_o$, wherein said summer and squaring stages implement the quarter-square algebraic identity as follows, $$V_o=\tfrac{1}{4}[(V_1+V_2)^2-(V_1-V_2)^2]=V_1V_2,$$

each differential summer stage comprising first through eighth MOS transistors including first and second input transistors having respective gates connected in differential mode to said first input $V_1$, third and fourth MOS transistors having respective gates connected in differential mode to said second input $V_2$, said first and second transistors have sources connected to each other, and to a negative supply voltage ($-V_{SS}$) via a first current source, and drains respectively connected in series with fifth and sixth NMOS transistors to a positive voltage source ($+V_{DD}$), the third and fourth transistors having sources connected to each other, and to $-V_{SS}$ via a second current source and drains connected respectively in series with the seventh and eighth transistors to $+V_{DD}$, fifth and sixth transistors having gates respectively connected to the interconnection between the third and seventh transistors and the interconnection between the fourth and eighth transistors, and the seventh and eighth transistors having gates also connected to $+V_{DD}$, each summer stage producing respective sum and difference signals ($V_x$, $V_y$) based on the polarity of the interconnection of the input signals thereto, across the interconnection between the first and fifth transistors and the interconnection between the second and sixth transistors, each squaring stage comprising a pair of input MOS transistors having gates connected in differential mode to a respective of the outputs $V_x$, $V_y$ of said summer stages, sources interconnected to each other and connected to $-V_{SS}$ via a third current source and drains interconnected to each other, and to $+V_{DD}$ through a load, each squaring stage producing an output at the interconnection of said drains of said pair of input MOS transistors, wherein the transistors of said squaring stages are operated in a saturation region; and a differential-to-single-ended convertor coupled to the outputs of said squaring stages and having an output $V_o$ corresponding to the product of $V_1$ and $V_2$.

2. A multiplier according to claim 1, wherein said substrate has a conductivity, $N_A$, wherein $N_A$ is approximately $10^{15}$–$10^{16}$ cm$^{-3}$.

3. A multiplier according to claim 2, wherein $N_A = 6.7 \times 10^{15}$ cm$^{-3}$.

4. A multiplier according to claim 1, wherein each of said MOS transistors defines a channel length L and a channel width W, where $L > 20$ μm and $W = 10$ μm.

5. A multiplier according to claim 2, wherein each of said MOS transistors defines a channel length L and a channel width W, where $L > 10$ μm and $W > 10$ μm.

6. A multiplier according to claim 3, wherein each of said MOS transistors defins a channel length L and a channel width W, where $L > 10$ μm and $W > 10$ μm.

7. A multiplier according to claim 1, wherein said substrate is connected to $-V_{SS}$.

8. A multiplier according to claim 1, wherein said load of each squaring stage comprises:

a resistive load, $R_o$.

9. A multiplier according to claim 2, wherein said load of each squaring stage comprises:

a resistive load, $R_o$.

10. A multiplier according to claim 6, wherein said load of each squaring stage comprises:

a resistive load, $R_o$.

11. A multiplier according to claim 10 wherein $$V_o = K_p R_o (W/L)_3 \frac{(W/L)_1}{(W/L)_2} V_1 V_2,$$

where $K_p$ is a transconductance factor, $(W/L)_1$ is the aspect ratio of the first and second transistors of each summer stage, $(W/L)_2$ is the aspect ratio of the fifth and sixth transistors of each summer stage, and $(W/L)_3$ is the aspect ratio of the pair of input transistors of each squaring stage.

12. A multiplier according to claim 1, wherein said load of each squaring stage comprises:

a MOS transistor having a source connected to the interconnection of the drains of the pair of input transistors and a gate and a drain connected to $+V_{DD}$.

13. A multiplier according to claim 2, wherein said load of each squaring stage comprises:

a MOS transistor having a source connected to the interconnection of the drains of the pair of input transistors and a gate and a drain connected to $+V_{DD}$.

14. A multiplier according to claim 4, wherein said load of each squaring stage comprises:

a MOS transistor having a source connected to the interconnection of the drains of the pair of input transistors and a gate and a drain connected to $+V_{DD}$.

15. A multiplier according to claim 14, wherein, $$V_o = \sqrt{\frac{2(W/L)_3}{(W/L)_9}} \; \frac{\frac{(W/L)_1}{(W/L)_2}}{2(V_S + V_T)} V_1 V_2,$$

where $(W/L)_1$ is the aspect ratio of the first and second transistors of each summer stage, $(W/L)_2$ is the aspect ratio of the fifth and sixth transistors of each summer stage and $(W/L)_3$ is the aspect ratio of the pair of input transistors of each squaring stage, $(W/L)_9$ is the aspect ratio of said load MOS transistor, $V_T$ is the zero-bias threshold voltage and $V_s$ is a DC bias voltage presented at the interconnection of the sources of the first through fourth transistors of said summer stages.

16. A multiplier according to claim 1, wherein said transistors of said summer and squaring stages are NMOS transistors.

17. A multiplier according to claim 2, wherein said transistors of said summer and squaring stages are NMOS transistors.

18. A multiplier according to claim 6, wherein said transistors of said summer and squaring stages are NMOS transistors.

19. A multiplier according to claim 11, wherein said transistors of said summer and squaring stages are NMOS transistors.

20. A multiplier according to claim 15, wherein said transistors of said summer and squaring stages are NMOS transistors.

21. A multiplier according to claim 1 wherein each of said MOS transistor defines a channel length L and a channel width W, where $L \leqq 10$ μm. and $W \leqq 10$ μm.

22. A multiplier according to claim 1 wherein said MOS transistors having sources connected to a common mode are placed in a substrate isolation region formed by either pn isolation technique or dielectric isolation technique, or other device isolation method.

* * * * *